United States Patent [19]

Karnezos et al.

[11] Patent Number: 4,632,871
[45] Date of Patent: Dec. 30, 1986

[54] ANODIC BONDING METHOD AND APPARATUS FOR X-RAY MASKS

[75] Inventors: Marcos Karnezos, Palo Alto; Howard H. Nakanos, Sunnyvale; Armand P. Neukermans, Palo Alto, all of Calif.

[73] Assignee: Varian Associates, Inc., Palo Alto, Calif.

[21] Appl. No.: 580,600

[22] Filed: Feb. 16, 1984

[51] Int. Cl.$^4$ .............................................. B32B 9/00
[52] U.S. Cl. .................................................. 428/336
[58] Field of Search ............... 428/450, 427, 433, 469, 428/448, 336; 430/5; 204/16

[56] References Cited

U.S. PATENT DOCUMENTS

| 3,397,278 | 8/1968 | Pomerantz | 174/52 |
| 3,417,459 | 12/1968 | Pomerantz et al. | 29/589 |
| 4,139,443 | 2/1979 | Sakurai | 428/433 |
| 4,171,489 | 10/1979 | Adams et al. | 250/510 |
| 4,253,029 | 2/1981 | Lepselter et al. | 250/505 |
| 4,293,624 | 10/1981 | Buckley | 430/5 |
| 4,411,972 | 10/1983 | Narken et al. | 428/433 |
| 4,451,544 | 5/1984 | Kawabuki | 430/5 |

FOREIGN PATENT DOCUMENTS 2115949 9/1983 United Kingdom .

OTHER PUBLICATIONS

T. R. Anthony, "Anodic Bonding of Imperfect Surfaces," *Journal of Applied Physics*, vol. 54, No. 5, May 1983, pp. 2419-2428.

*Primary Examiner*—Edith Buffalow
*Attorney, Agent, or Firm*—Stanley Z. Cole; Kenneth L. Warsh

[57] ABSTRACT

A structure for use in an X-ray membrane (pellicle) mask is provided in which anodic bonding of layers is employed. Anodic bonding as used here provides a permanent bond between the layers, has zero thickness and provides substantial improvements in the obtained flatness of the mask by eliminating conventional glue for attachment. By applying a voltage between a layer, such as silicon, and a glass plate, and simultaneously heating both elements a permanent bond is established which is extremely flat thus providing minimum misalignment of the mask during subsequent X-ray lithography fabrication.

18 Claims, 8 Drawing Figures

ANODIC BONDING METHOD AND APPARATUS FOR X-RAY MASKS

This invention relates to a method of making X-ray masks, and to the articles produced therefrom.

The standard method of making X-ray masks involves depositing an inorganic layer on a double polished silicon wafer. This wafer is then bonded to a Pyrex support ring using an epoxy or other adhesive. The silicon wafer is then etched through a hole in the Pyrex plate, leaving a free standing X-ray mask.

One of the drawbacks of the above method is that the difficulty of obtaining a glue layer of uniform thickness causes uncontrollable changes in the gap between the mask and the silicon wafer.

SUMMARY OF THE INVENTION

In accordance with the illustrated preferred embodiment, the present invention uses anodic bonding in the fabrication of X-ray mask structures. Unlike the mask structures of the prior art (which use glue), the method used in the making of this mask eliminates the glue thus removing one of the variables which causes undesirable non-uniform variation of mask thickness. With this method substantial improvements in mask flatness are obtained. Although anodic bonding per se is not new, it is believed that it has not been applied heretofore to the making of X-ray masks.

BRIEF DESCRIPTION OF THE DRAWINGS

FIG. 2B shows the structure as illustrated in FIG. 2A after subsequent processing steps.

DETAILED DESCRIPTION OF THE INVENTION

Figure 1A:
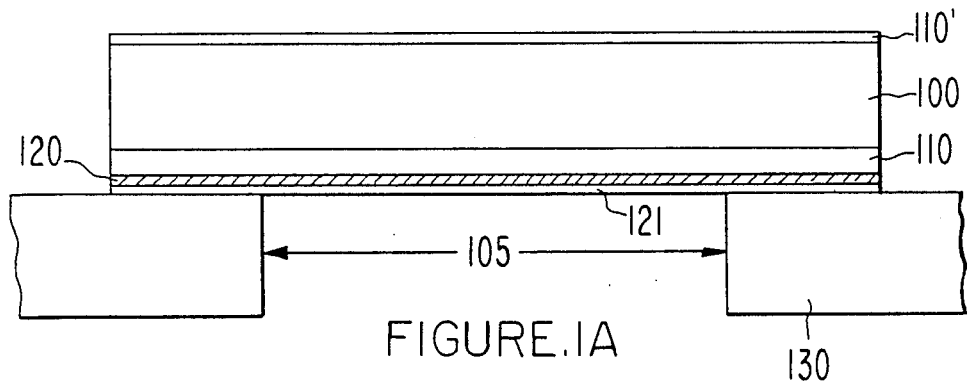
FIG. 1A shows the structure of the preferred embodiment of a layered structure for use in an X-ray mask pellicle.

FIG. 1A illustrates a cross-section of the preferred embodiment of the present invention. In accordance with aspects of the invention, an inorganic layer of boron nitride 110 is deposited by chemical vapor deposition (CVD) techniques on a silicon substrate 100 having a thickness typically in the range of 2 to 6 microns. Deposition conditions are chosen such that the deposited boron nitride layer is under tensile stress, hence the substrate will curl upward exposing the underside of the substrate during deposition. Typically, deposition temperatures range from 300 to 600 degrees celsius, pressures range from 0.1 to 1.0 torr, and deposition times range from 30 to 240 minutes. Consequently because of this curling, the underside will concurrently be coated with a thin layer 110' of boron nitride. Deposition of boron nitride layer 110' on the silicon substrate 100 is typically in the thickness range of 0.01 to 1.0 microns. A chromium layer 120 is deposited, for example, by sputtering or evaporation techniques over boron nitride layer 110 and an aluminum layer 121 is then deposited over chromium layer 120 also by sputtering or evaporation techniques. Another material that can also be used for layer 120 is titanium metal. The total metal thickness of layer 120 and layer 121 is in the range of 0.1 to 0.5 microns. The aluminum layer 121 is bonded to support plate 130 over region 108 using modified anodic bonding techniques. The support member 130 is made of a strong, durable and dimensionally stable material. One example of a borosilicate glass is Pyrex glass (Pyrex is a registered trademark of Corning Glass Works) which has a thermal expansion coefficient approximately equal to that of silicon. In addition, Pyrex is relatively inexpensive and easy to form in a variety of shapes.

Typical prior art anodic bonding techniques are disclosed in U.S. Pat. Nos. 3,397,278 and 3,417,459 which were issued to D. I. Pomerantz in 1968. Anodic bonding techniques are further illustrated in an article by Thomas R. Anthony entitled "Anodic Bonding of Imperfect Surfaces" published in the *Journal of Applied Physics*, No. 54, Volume 5, May 1983. Anodic bonding as applied here involves the immediate contact of the metal layer 121 with a Pyrex plate 130 and subseqently applying a voltage of the right polarity and magnitude between the two and heating the structure to form a permanent bond. Typical bonding voltages in the range of 750 to 3000 volts and temperatures in the range of 200 to 500 degrees celsius are applied for a total processing time of 1 hour. This method is superior to the usual bonding techniques, because it eliminates variations in the thickness of the epoxy.

Figure 1B:
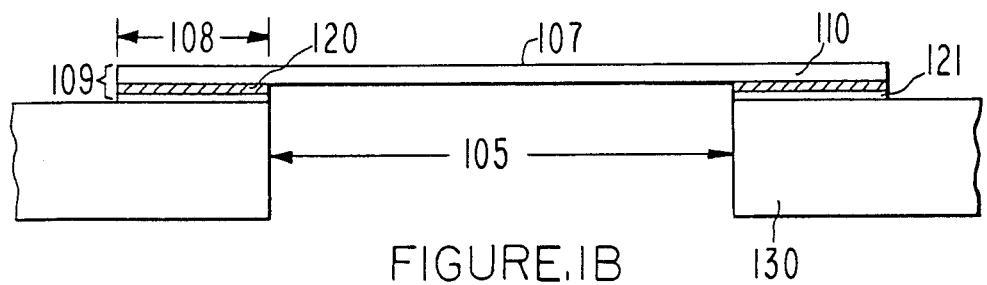
FIG. 1B shows the structure as illustrated in FIG. 1A after subsequent processing steps.

As illustrated in FIG. 1B, the layer of boron nitride 110' is removed over the silicon substrate 100 typically by dry etching techniques and then the total silicon substrate 100 is removed by standard silicon etching techniques, such as HF, $HNO_3$, and Acetic Acid. The exposed surface 107 of boron nitride layer 110 retains the surface smoothness of the silicon substrate 100 on which it was deposited after the silicon substrate 100 is removed, thus exposed surface 107 is extremely smooth. The chromium layer 120 and aluminum layer 121 over region 105 are removed in a metal etch, leaving only a layer of boron nitride 110 in place over the Pyrex plate 130. Since the chromium layer 120 and the aluminum layer 121 are deposited uniformly over region 108 the surface flatness of the pellicle is entirely set by only one parameter, that is the circular flatness of the Pyrex plate 130. A membrane flatness as good as 0.3 micron over a four inch diameter pellicle is obtained. Therefore, anodic bonding in accordance with the present invention provides an excellent method for an X-ray mask support 109 to its Pyrex support plate 130.

Figure 2A:
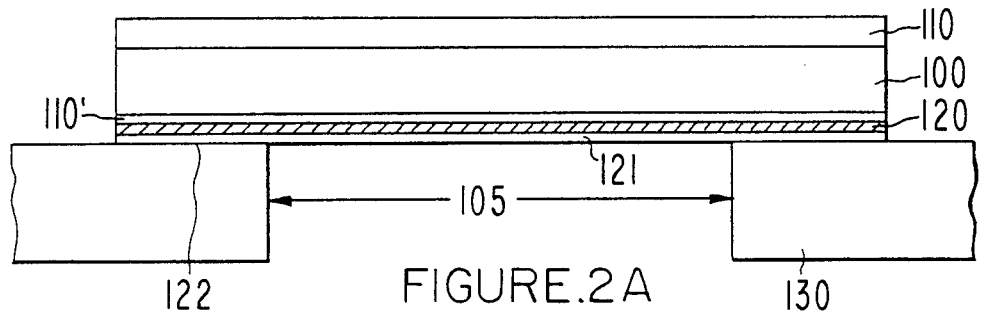
FIG. 2B shows the structure of a second embodiment of a layered structure for use in an X-ray mask pellicle.

FIG. 2A illustrates a cross-section of a second embodiment of the present invention. The inorganic layer 110 is a CVD layer of boron nitride. A metal layer 120, typically chromium, is deposited, for example, by sputtering or evaporation techniques, over a layer of boron nitride 110'. Metal layer 120 is then deposited with a layer 121 of aluminum to produce a uniform conductance layer. A single layer of aluminum can be used in place of layers 120 and 121; however, a smoother bonding surface 122 can be obtained using a combination of metal layer 120 and aluminum layer 121. The bonding surface 122 is then put in contact with the Pyrex plate 130 and anodic bonding processing conditions are instituted. Typically, the bonding voltages are in the range of 1000 to 3000 volts, bonding temperatures in the range of 200 to 400 degrees celsius and a processing time of 10 minutes or more. Other metals such as nickel, titanium, silicon or a combination thereof can be used for metal layers 120 and 121.

Figure 2B:
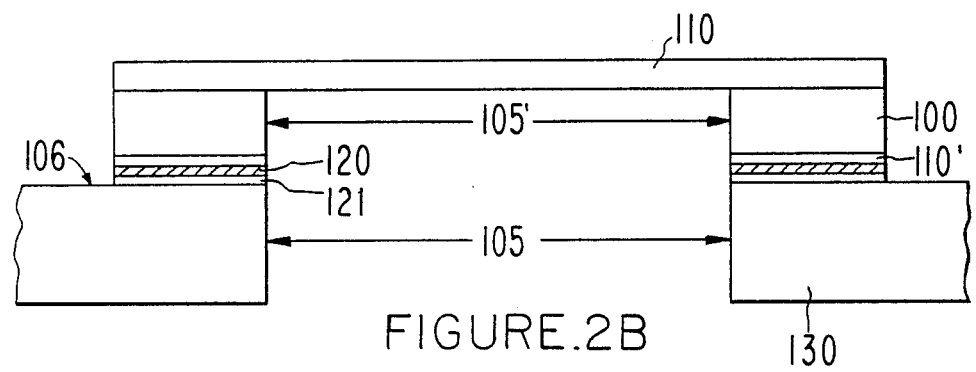

FIG. 2B shows chromium layer 120 and aluminum layer 121 removed over region 105' in a metal etch, typically HF and HNO₃, and the exposed layer of boron nitride 110' is then removed typically by reactive ion etching techniques. The silicon substrate 100 exposed over region 105' is subsequently removed in a silicon etch similar to the one used in FIG. 1B etching solution. The membrane flatness is now determined by both the silicon substrate 100 and the Pyrex plate 130.

Figure 3A:
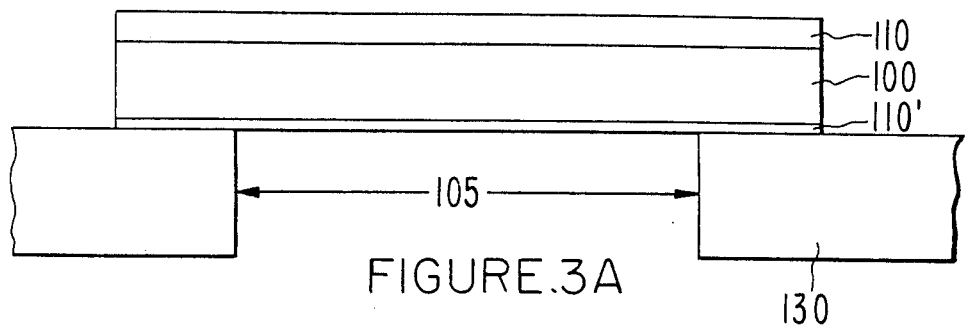
FIG. 3A shows the structure of a third embodiment of a layered structure for use in an X-ray mask pellicle.

FIG. 3A shows a cross-section of a layered structure of a third embodiment of the present invention. An inorganic layer 110 is grown on a silicon substrate 100 using low pressure chemical vapor deposition techniques. The inorganic layer 110 is typically boron nitride having a thickness in the range of 1 to 4 microns. Other materials that can be used for inorganic layer 110 are boron carbide, silicon carbide, and silicon nitride. The layer 110' is then bonded to a support member 130 over region 105 by anodic bonding techniques similar to the conditions used in FIG. 1A.

Figure 3B:
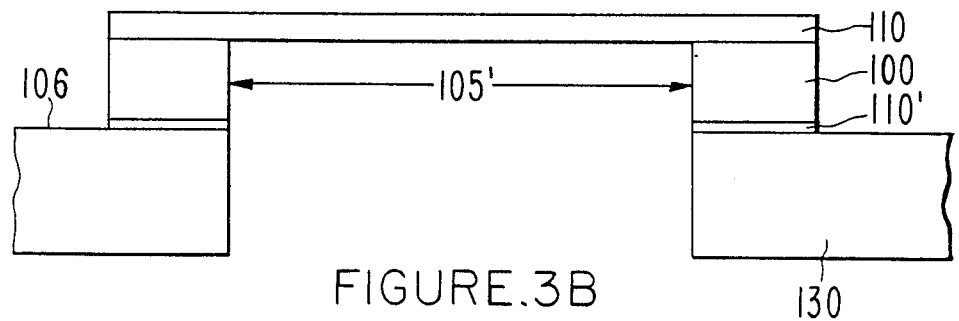
FIG. 3B shows the structure as illustrated in FIG. 3A after subsequent processing steps.

FIG. 3B shows layer 110' and silicon substrate 100 removed over region 105' to expose inorganic layer 110. The layer 110' is removed by reactive ion etching techniques and subsequently the silicon substrate is etched in a mixture of Acetic, Nitric and Hydrofluoric acids. The hole in the Pyrex ring (shown as region 105 in FIG. 3A) acts as a mask during the etch process and defined pellicle rims are obtained. If epoxy is used, as in the prior art, beads of epoxy flowing over rim 106, may more often than not produce protrusions along rim 106. The anodic bond is impervious to attack in the etchant used to remove the silicon substrate.

Figure 4A:
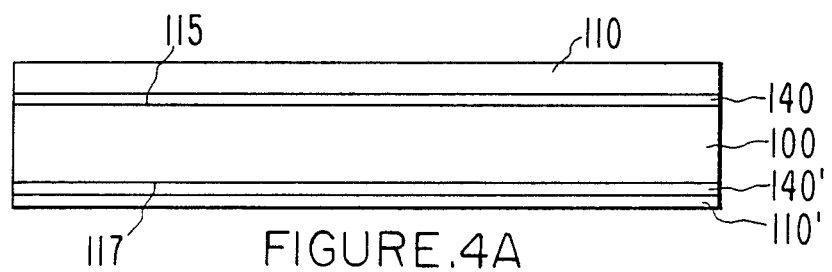
FIG. 4A shows the structure of an alternative embodiment of a layered structure for use in an X-ray mask pellicle.

An alternative embodiment of the present invention can be seen in FIG. 4A. On exposed surfaces 115 and 117 of silicon substrate 100, insulating layers 140 and 140' are grown by thermal oxidation techniques. Insulating layers 140 and 140' are typically made of silicon dioxide. By conventional chemical vapor deposition techniques, boron nitride layers 110 and 110' are subsequently deposited over silicon dioxide layers 140 and 140', respectively.

Figure 4B:
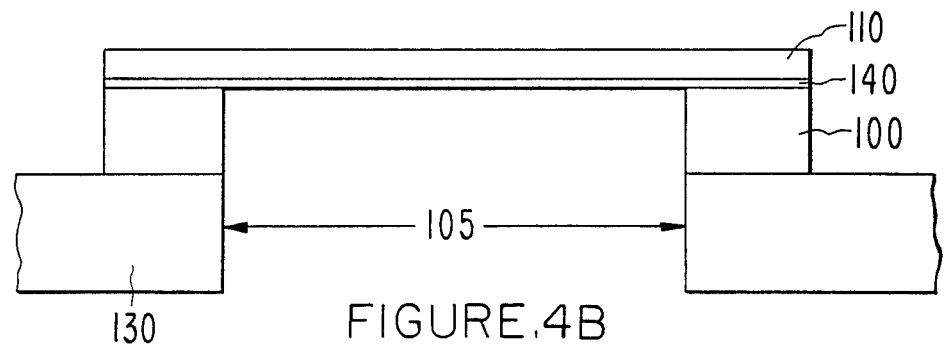
FIG. 4B shows the structure as illustrated in FIG. 4A after subsequent processing steps.

As further illustrated in FIG. 4B, boron nitride layer 110' and silicon dioxide layer 140' are removed over silicon substrate 100 by conventional etching techniques, such as CF₄:O₂ followed by the wet etching of the silicon dioxide layer 140'. Silicon substrate 100 is then anodically bonded to Pyrex plate 130 using bonding temperatures in the range of 200 to 400 degrees celsius, bonding voltages in the range of 1000 to 3000 volts for a total processing time of 60 minutes. Subsequently silicon substrate 100 over region 105 is etched by conventional silicon etch techniques to expose boron nitride layer 140.

What is claimed is:

1. A mask structure for X-ray lithography comprising:
    a thin flat X-ray transmissive membrane selected from the group consisting of boron nitride, boron carbide, silicon nitride, silicon carbide, including a working area for forming an absorber pattern and a peripheral area for support thereof;
    a rigid support frame having a flat surface for supporting said membrane outwardly of the working area; and
    interface means interposed between the membrane and the flat surface of the support frame for facilitating anodic bonding of the membrane to the support frame without the use of adhesive material so as to provide an extremely flat, stable membrane surface, said interface means being anodically bonded to the flat surface of the support frame.

2. The mask structure as defined in claim 1 wherein said interface means comprises a metal interface layer.

3. The mask structure as defined in claim 2 wherein said membrane comprises boron nitride.

4. The mask structure as defined in claim 3 wherein said membrane has a thickness in the range of 2 to 6 microns.

5. The mask structure as defined in claim 2 wherein said metal layer comprises aluminum.

6. The mask structure as defined in claim 2 wherein said metal layer comprises a first metal selected from the group consisting of chromium and titanium, said first metal being deposited on the membrane, said metal layer further comprising aluminum deposited on said first metal and anodically bonded to said support frame.

7. The mask structure as defined in claim 6 wherein the metal layer has a thickness in the range of 0.1 to 0.5 micron.

8. The mask structure as defined in claim 7 wherein the support frame comprises a borosilicate glass ring.

9. The mask structure as defined in claim 1 wherein said interface means comprises a silicon layer with said membrane deposited on a first surface thereof, and a metal layer interposed between a second surface of said silicon layer and said support frame and anodically bonded to the support frame.

10. The mask structure as defined in claim 9 wherein said metal layer comprises chromium deposited on the second surface of the silicon layer, said metal layer further comprising aluminum deposited on the chromium and anodically bonded to said support frame.

11. The mask structure as defined in claim 9 wherein said metal layer comprises aluminum deposited on the second surface of the silicon layer and anodically bonded to said support frame.

12. The mask structure as defined in claim 9 wherein said metal layer is selected from the group consisting of nickel, titanium, silicon and combinations thereof.

13. The mask structure as defined in claim 10 wherein said membrane is selected from the group consisting of boron nitride and silicon carbide.

14. The mask structure as defined in claim 1 wherein said interface means comprises a silicon layer with said membrane deposited on a first surface thereof, and a layer of the membrane material interposed between a second surface of the silicon and the support frame, said layer of membrane material being anodically bonded to the support frame.

15. The mask structure as defined in claim 14 wherein said membrane is selected from the group consisting of boron nitride silicon carbide, boron carbide and silicon nitride.

16. The mask structure as defined in claim 1 wherein said interface means comprises a silicon layer anodically bonded to said support frame.

17. The mask structure as defined in claim 16 wherein said membrane is selected from the group consisting of boron nitride and silicon carbide.

18. The mask structure as defined in claim 17 wherein a layer of silicon dioxide is interposed between the membrane and the silicon layer.

* * * * *